United States Patent
Miyamoto

(10) Patent No.: US 9,711,700 B2
(45) Date of Patent: Jul. 18, 2017

(54) LIGHT EMITTING DEVICE AND METHOD FOR PRODUCING THE SAME

(71) Applicant: NICHIA CORPORATION, Anan-shi (JP)

(72) Inventor: Kimihiro Miyamoto, Tokushima (JP)

(73) Assignee: NICHIA CORPORATION, Anan-shi (JP)

(*) Notice: Subject to any disclaimer, the term of this patent is extended or adjusted under 35 U.S.C. 154(b) by 0 days.

(21) Appl. No.: 14/979,558

(22) Filed: Dec. 28, 2015

(65) Prior Publication Data
US 2016/0190414 A1   Jun. 30, 2016

(30) Foreign Application Priority Data

Dec. 26, 2014   (JP) ................. 2014-266026
Dec. 21, 2015   (JP) ................. 2015-249120

(51) Int. Cl.
*H01L 25/00* (2006.01)
*H01L 33/62* (2010.01)
*H01L 25/075* (2006.01)
*H01L 33/48* (2010.01)

(52) U.S. Cl.
CPC .......... *H01L 33/62* (2013.01); *H01L 25/0753* (2013.01); *H01L 33/486* (2013.01); *H01L 2224/45144* (2013.01); *H01L 2224/48091* (2013.01); *H01L 2224/48137* (2013.01); *H01L 2933/0066* (2013.01)

(58) Field of Classification Search
None
See application file for complete search history.

(56) References Cited

U.S. PATENT DOCUMENTS

| 2008/0012036 A1* | 1/2008 | Loh | H01L 33/483 257/99 |
| 2010/0148211 A1* | 6/2010 | Sheu | H01L 33/486 257/99 |
| 2012/0132937 A1* | 5/2012 | Chan | H01L 25/0753 257/89 |
| 2012/0132949 A1* | 5/2012 | Watari | H01L 33/54 257/99 |

(Continued)

FOREIGN PATENT DOCUMENTS

| JP | 2006-093738 | 4/2006 |
| JP | 3157844 U | 3/2010 |

(Continued)

*Primary Examiner* — Evren Seven
(74) *Attorney, Agent, or Firm* — Mori & Ward, LLP

(57) ABSTRACT

A light emitting device includes a light emitting element and a package. The package includes a first lead frame, a second lead frame, and a resin. The first lead frame has a first surface on which the light emitting element is provided. The first lead frame has a first overlap portion. The second lead frame is spaced apart from the first lead frame and has a second overlap portion. The first overlap portion and the second overlap portion overlap at an overlap position so that the first lead frame extends from the overlap position toward a first direction and a second direction opposite to the first direction and so that the second lead frame extend from the overlap position toward a third direction and a fourth direction opposite to the third direction as viewed along a line substantially perpendicular to the first surface.

15 Claims, 10 Drawing Sheets

(56) References Cited

U.S. PATENT DOCUMENTS

| | | | |
|---|---|---|---|
| 2013/0161670 A1* | 6/2013 | Peng | H01L 33/647 |
| | | | 257/98 |
| 2013/0161681 A1 | 6/2013 | Lin et al. | |
| 2014/0117403 A1* | 5/2014 | Hayashi | H01L 33/62 |
| | | | 257/99 |
| 2015/0001559 A1* | 1/2015 | Sasaoka | H01L 33/486 |
| | | | 257/88 |
| 2015/0187685 A1* | 7/2015 | Preuss | H01L 22/14 |
| | | | 324/691 |
| 2015/0228619 A1* | 8/2015 | Sawada | H01L 33/54 |
| | | | 257/98 |

FOREIGN PATENT DOCUMENTS

| | | |
|---|---|---|
| JP | 2011-228589 | 11/2011 |
| JP | 2012-109529 | 6/2012 |
| JP | 2013-135226 | 7/2013 |
| JP | 2013-540362 | 10/2013 |
| JP | 2014-103365 | 6/2014 |
| WO | WO 2012/050994 | 4/2012 |

\* cited by examiner

LIGHT EMITTING DEVICE AND METHOD FOR PRODUCING THE SAME

CROSS-REFERENCE TO RELATED APPLICATIONS

The present application claims priority under 35 U. S. C. §119 to Japanese Patent Application No. 2014-266,026, filed Dec. 26, 2014 and Japanese Patent Application No. 2015-249,120, filed Dec. 21, 2015. The contents of these applications are incorporated herein by reference in their entirety.

BACKGROUND OF THE INVENTION

1. Field of the Invention

The present disclosure relates to a light emitting device and a method for producing a light emitting device.

2. Description of the Related Art

In recent years, general lighting devices are becoming more popular which include light emitting diodes (hereinafter also referred to as LEDs), which have low power consumption, instead of conventional filament lamps. The applications of LEDs broaden to a back light source, lighting, a vehicle light source, and the like. An example of such light emitting device 1000 includes LEDs 1001, which are installed on a lead frame 1022 as shown in a perspective view of FIG. 10. The lead frame 1022 is used for electrical connection to the outside. The lead frame 1022 is embedded in a resin package 1030 as shown in a cross-sectional view of FIG. 11.

In order to improve the durability of this type of light emitting device, the strength of the resin package is required to be higher. Also, since higher output power is required for this type of light emitting device in recent years, a number of LEDs are installed to increase its light amount. To address this, the light emitting device necessarily dissipates a larger amount of heat. In addition, power supplied to the light emitting device is increased for higher output power, while resistance to high pressure becomes important for the device. Additionally, it is required to prevent tarnishing of the Ag-plated lead frame caused by sulfuration, which is likely to occur with aging. See Japanese Laid-Open Patent Publication No. 2013-540,362 A, and Japanese Patent Laid-Open Publication No. JP 2006-093,738 A.

SUMMARY OF THE INVENTION

According to one aspect of the present invention, a light emitting device includes a light emitting element and a package. The package includes a first lead frame, a second lead frame, and a resin. The first lead frame has a first surface on which the light emitting element is provided. The first lead frame has a first overlap portion and an entire outer surface made from a first metal. The second lead frame is spaced apart from the first lead frame and has a second overlap portion. The second lead frame is electrically connected to the light emitting element and has an entire surface made from a second metal different from the first metal. The first overlap portion and the second overlap portion overlap at an overlap position so that the first lead frame extend from the overlap position toward a first direction and a second direction opposite to the first direction and so that the second lead frame extend from the overlap position toward a third direction and a fourth direction opposite to the third direction as viewed along a line substantially perpendicular to the first surface. The resin covers the first lead frame and the second lead frame. The first overlap portion and the second overlap portion are embedded in the resin.

According to another aspect of the present invention, a method for producing a light emitting device includes providing a first lead frame having a first surface on which a light emitting element is to be provided. The first lead frame has a first overlap portion and an entire outer surface made from a first metal. A second lead frame is provided so that the second lead frame is spaced apart from the first lead frame. The second lead frame is to be electrically connected to the light emitting element, has a second overlap portion, and has an entire surface made from a second metal different from the first metal. The first lead frame and the second lead frame are arranged so that the first overlap portion and the second overlap portion overlaps at an overlap position, so that the first lead frame extends from the overlap position toward a first direction and a second direction opposite to the first direction, and so that the second lead frame extends from the overlap position toward a third direction and a fourth direction opposite to the third direction as viewed along a line substantially perpendicular to the first surface. The first lead frame and the second lead frame are covered with a resin material so as to embed the first overlap portion and the second overlap portion in the resin material and so as to provide a package to include the first lead frame and the second lead frame in the package.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF EMBODIMENTS

Figure 1:
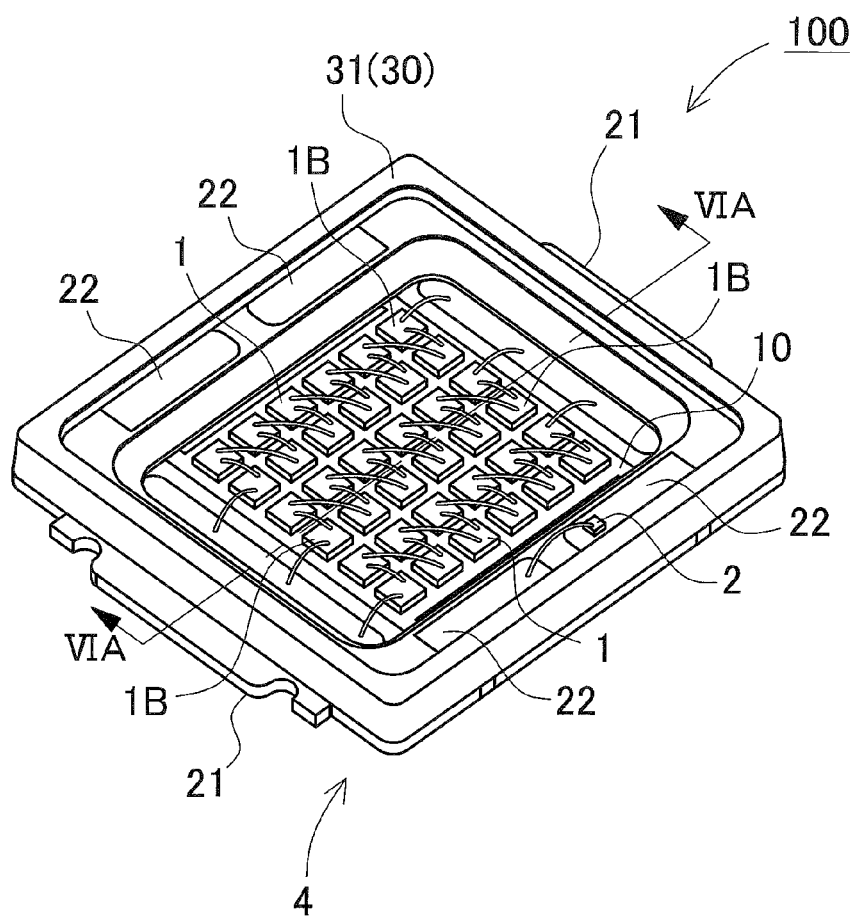
FIG. 1 is a schematic perspective view showing a light emitting device according to a first embodiment of the present invention.

The embodiments will now be described with reference to the accompanying drawings, wherein like reference numerals designate corresponding or identical elements throughout the various drawings. It should be appreciated, however, that the embodiments described below are illustrations of a light emitting device and a method for producing a light emitting device to give a concrete form to technical ideas of the invention, and a light emitting device and a method for producing a light emitting device of the invention are not specifically limited to description below. Furthermore, it should be appreciated that the members in the claims described below are not specifically limited to members in the embodiments. Unless otherwise specified, any dimensions, materials, shapes and relative arrangements of the parts described in the embodiments are given as an example and not as a limitation. Additionally, the sizes and the positional relationships of the members in each of drawings are occasionally shown exaggeratingly for ease of explanation. Members same as or similar to those of the embodiments of this invention are attached with the same designation and the same reference signs, and their description is omitted. In addition, a plurality of structural elements of the embodiments of the present invention may be configured as a single part that serves the purpose of a plurality of elements, on the other hand, a single structural element may be configured as a plurality of parts that serve the purpose of a single element. Also, the description of some of examples or embodiments may be applied to other examples, embodiments or the like.

First Embodiment

Figure 2:
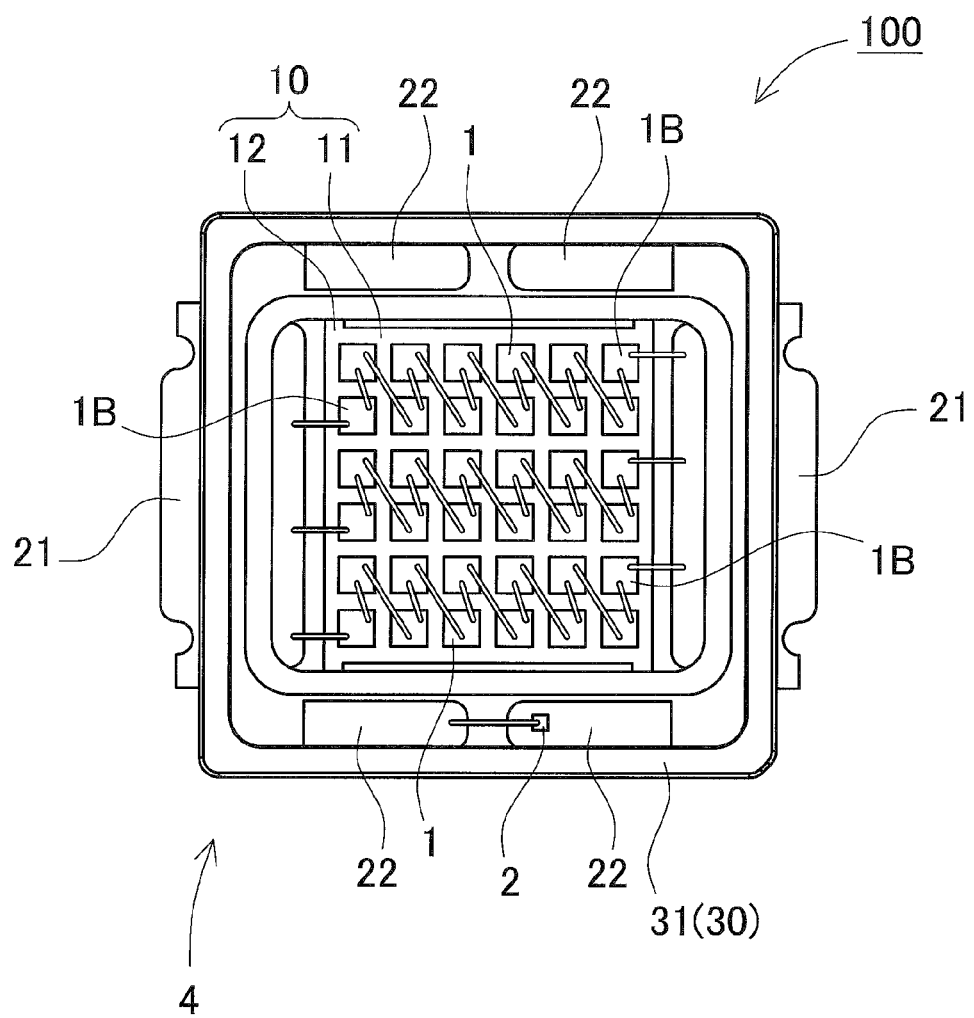
FIG. 2 is a schematic plan view of the light emitting device shown in FIG. 1.
Figure 3:
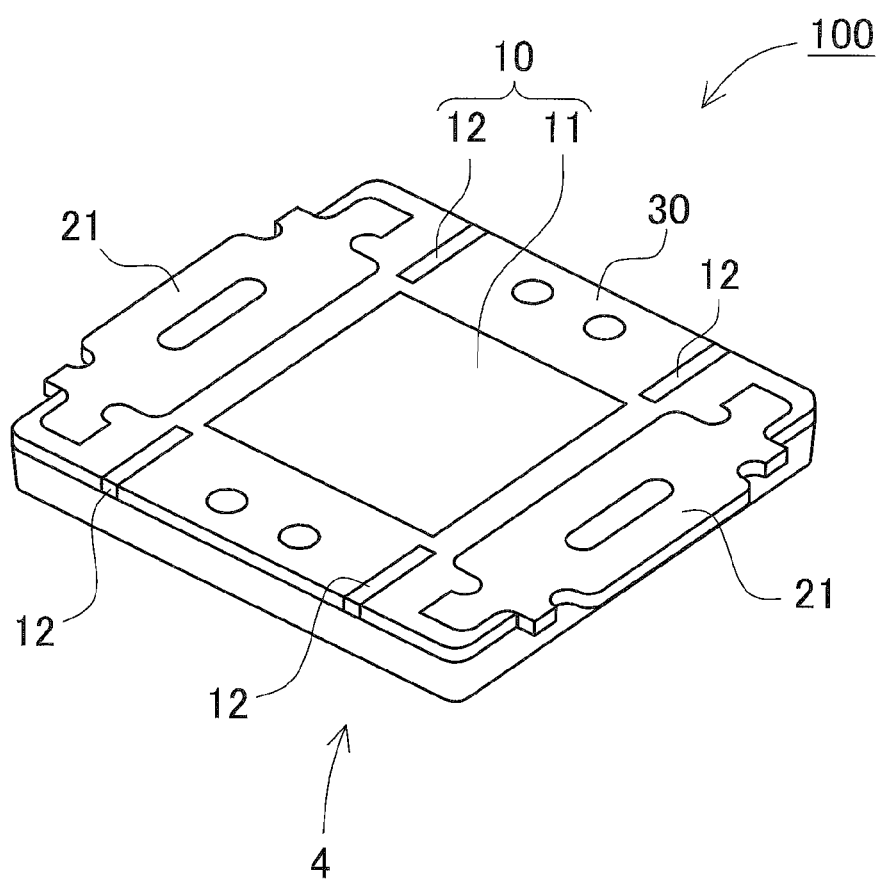
FIG. 3 is a schematic perspective view showing the light emitting device shown in FIG. 1 as viewed from the bottom side.
Figure 4:
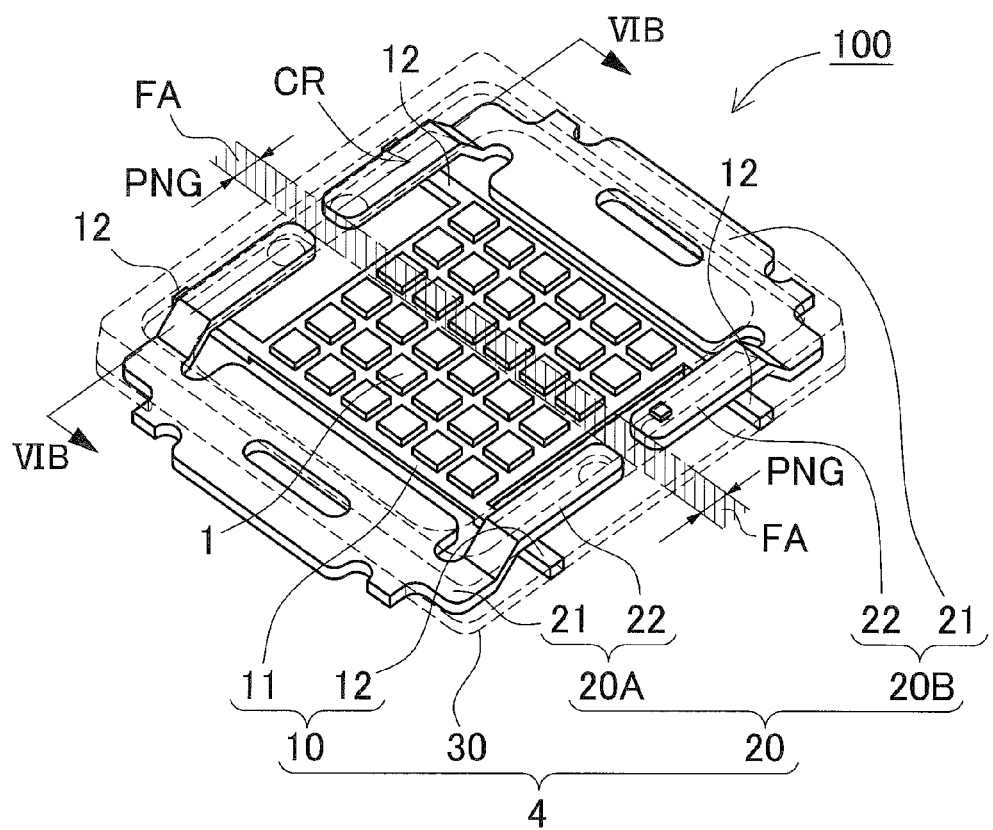
FIG. 4 is a schematic transparent perspective view showing the positional relationship between first and second lead frames of the light emitting device shown in FIG. 1.
Figure 5:
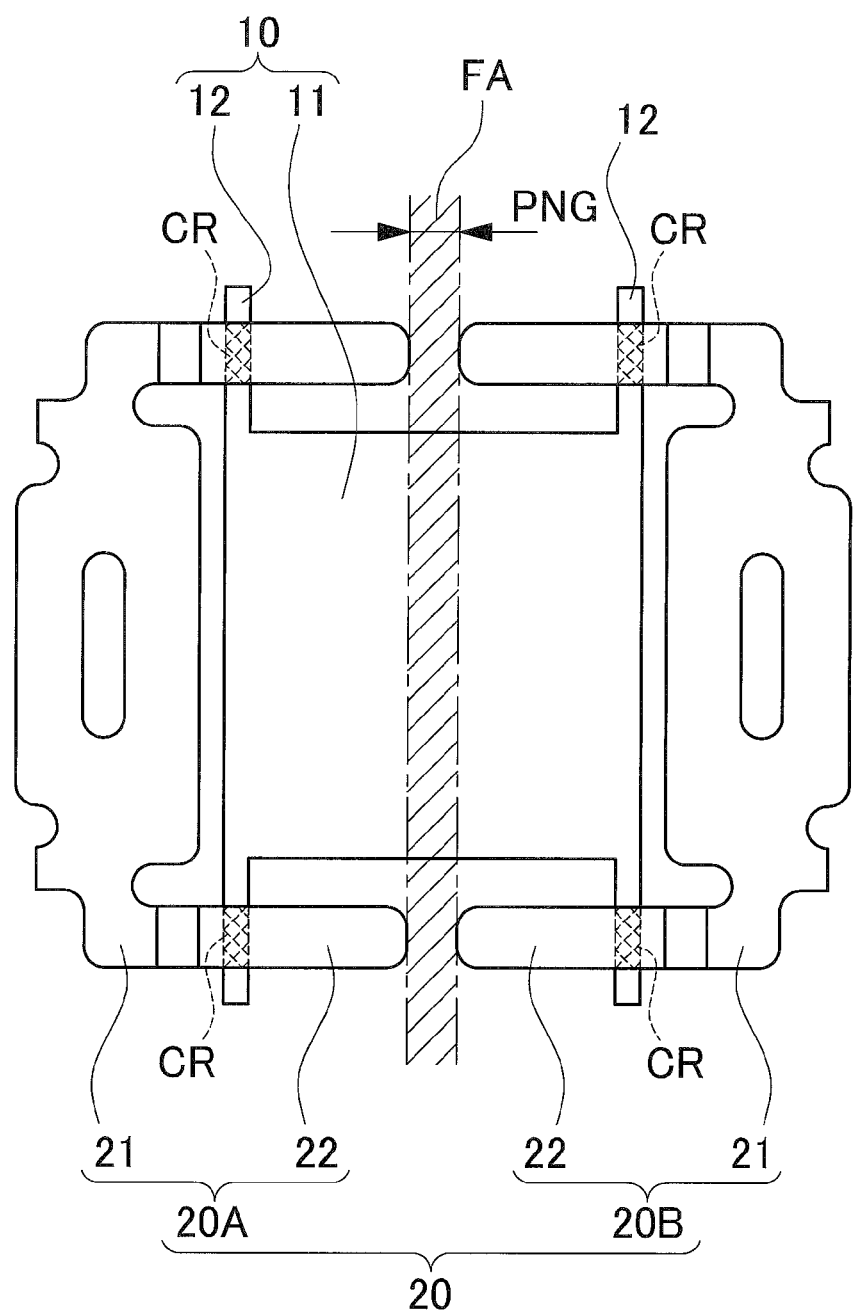
FIG. 5 is a schematic transparent plan view showing the positional relationship between the first and second lead frames shown in FIG. 4.

A light emitting device 100 according to a first embodiment of the present invention is shown in FIGS. 1 to 6B. Specifically, FIGS. 1, 2 and 3 are perspective, plan and bottom-side perspective views of the light emitting device 100, respectively. FIG. 4 is a transparent perspective view showing the positional relationship between first and second lead frames 10 and 20. FIG. 5 is a transparent plan view showing the positional relationship between the first and second lead frames 10 and 20. FIG. 6A is a cross-sectional view of the light emitting device 100 shown in FIG. 1 taken along the line VIA-VIA.

Figure 6A:
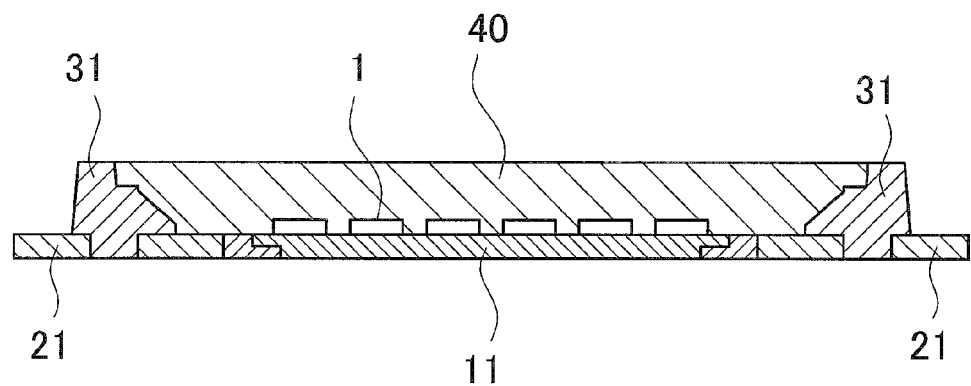
FIG. 6A is a schematic cross-sectional view of the light emitting device shown in FIG. 1 taken along the line VIA-VIA.
Figure 6B:
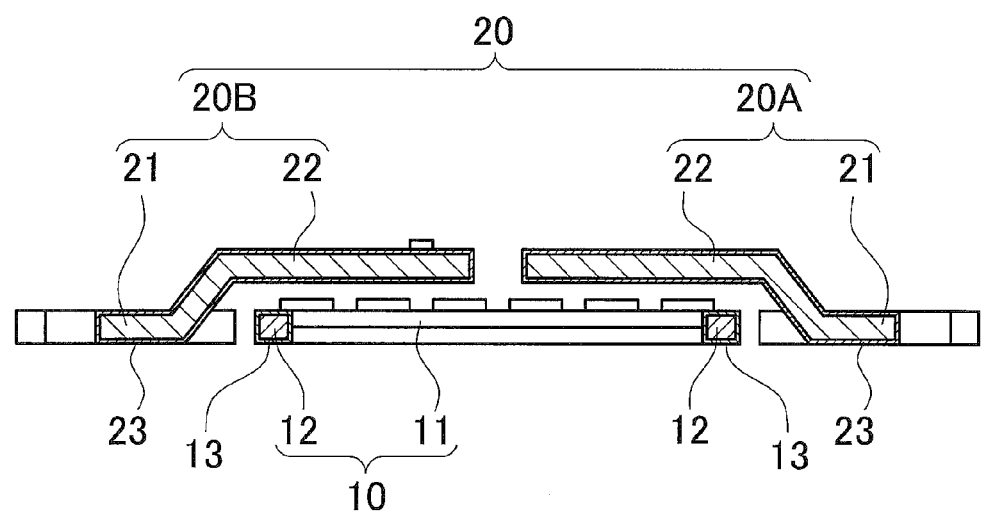
FIG. 6B is a schematic cross-sectional view of the light emitting device taken along the line VIB-VIB.

FIG. 6B is a cross-sectional view of the light emitting device 100 showing overlap areas of the first and second lead frames 10 and 20. The illustrated light emitting device 100 includes light emitting elements 1, and a package 4. The package 4 includes the first and second lead frames 10 and 20, and a resin portion (a resin) 30. The light emitting elements 1 are mounted on one of the surfaces of the first lead frame 10. The light emitting elements 1 are electrically connected to the second lead frame 20. The first and second lead frames 10 and 20 are covered by the resin portion 30. The first lead frame 10 mainly serves as a mount for the light emitting elements 1, and reflects light from the light emitting elements 1 toward the light-extraction side. The second lead frame 20 serves to supply electric power to the light emitting elements 1, which are electrically connected to the second lead frame 20. The first and second lead frames 10 and 20 are spaced away from each other. The first and second lead frames 10 and 20 are embedded in the resin portion 30 with at least a part of the second lead frame 20 being arranged above the first lead frame 10 whereby at least partially overlapping the second lead frame 20 with the first lead frame 10. The first and second lead frames 10 and 20 are preferably formed of different metals of plates or coated with different types of metals.

(Light Emitting Element 1)

Semiconductor light emitting elements such as light emitting diodes and semiconductor lasers can be used as the light emitting elements 1. The semiconductor light emitting elements can be suitably formed of semiconductors such as ZnS, SiC, GaN, GaP, InN, AlN, ZnSe, GaAsP, GaAlAs, InGaN, GaAlN, AlInGaP, and AlInGaN deposited as a light-emitting layer on the substrate by liquid phase epitaxy, HDVPE, MOCVD, and the like. The light emission wavelength of the semiconductor light emitting element can be variously selected from ultraviolet light to infrared light by selecting the materials and the crystal mixture ratio of semiconductor. In particular, in the case where the light emitting device is intended for use outdoors, high power light emitting elements are required. In this case, a nitride semiconductor is preferably used for the materials of a high power green or blue light emitting element. For example, $In_xAl_yGa_{1-x-y}N$ ($0 \le x \le 1$, $0 \le y \le 1$, $x+y \le 1$), and the like can be used as the material of the light emitting layer. Also, this type of light emitting element can be used together with various types of phosphors (discussed later) which can be excited by light from the light emitting element and emit light with wavelengths different from the wavelength of the light emitted from the light emitting element. As a material of a red light emitting element, gallium-aluminum-arsenide-based semiconductors, or aluminum-indium-gallium-phosphide-based semiconductors can preferably be used. In addition, in the case where the light emitting device is used for a color display, the light emitting device preferably includes red, green, and blue LED chips which have wavelength ranges of 610 to 700 nm, 495 to 565 nm, and 430 to 490 nm, respectively.

The light emitting elements 1 are mounted on the first lead frame, and for the mounting, bonding member is used. For example, in the case where the light emitting elements 1 are formed of nitride-based semiconductor layers deposited on a sapphire substrate, and emit blue or green light, an epoxy resin, a silicone resin, or the like can be used as the bonding member. Also, in terms of degradation of the bonding member caused by light and heat from the light emitting elements, a metal layer is provided on the back surface of the light emitting element with a metal such as Al. Solder such as Au—Sn eutectic solder, brazing metal such as low melting point metal may be used as the bonding member without using resin. In the case where the light emitting element includes the electrodes which are formed on both its top and bottom surfaces, for example, in the case of a light emitting element which is formed of GaAs or the like, and emits red light is used, the light emitting element can be bonded by an electrically conductive paste (e.g., silver, gold, and palladium), or the like.

The light emitting elements 1 can be electrically connected to the second lead frame 20. Any suitable method can be used for the electrical connection. For example, wire bonding can be used for electrical connection between the light emitting elements 1. Also, the electrodes can be electrically connected to the lead frame without using wire by flip-chip mount method, which the electrodes disposed on the surface of the light emitting element are served as the mount surface.

In the case where a plurality of light emitting elements 1 are mounted on the first lead frame 10, it is preferable that they are evenly distributed on a mount portion 11, which serves as the light-emitting-element mount surface, of the first lead frame 10. If one light emitting element 1 is mounted on the first lead frame 10, it is preferably located in proximity to the center of the mount portion 11. Such arrangement can eliminate imbalance of the light emitting element(s) 1, and can provide substantially uniform light emission. In this embodiment, the light emitting device 100 is designed for lighting use, and includes a plurality of light emitting elements 1. More specifically, as shown in FIG. 1, the light emitting elements 1 are arranged in a six-by-six array so that total 36 pieces of light emitting elements 1 are mounted on the mount portion 11. Any number of light emitting elements, and any arrangement of light emitting elements can be used. For example, the light emitting elements 1 may be aligned in a rectangular array, in which the numbers of rows and columns are not necessarily the same. Also, the light emitting elements 1 may be arranged in a circular or polygonal shape in a plan view.

(Resin Portion 30)

The resin portion 30 has a recessed part on an upper surface side of the light emitting device. The recessed part accommodates the light emitting elements 1. As shown in FIGS. 1, 2, etc., the resin portion 30 has a portion formed in a frame shape which has a roughly quadrangle outline shape as viewed in plan view, and surrounds the light-emitting-element mount surface as viewed in plan view. That is, the resin portion 30 includes a frame part 31, and has the recessed part defined by the frame part 31. The first lead frame 10 is embedded in the resin portion 30 so as to be exposed from the resin portion on the bottom surface of the recessed part. Also, the second lead frame 20 is embedded in the resin portion 30 so as to the portion of the second lead frame extends from two opposed lateral surfaces of the resin portion 30. The resin portion 30 is preferably formed of a good electrically insulating resin.

Examples of the materials of the resin portion 30 can be thermoplastic resins such as aliphatic polyamide resin, semi-aromatic-polyamide resin, polyethylene terephthalate, polycyclohexane terephthalate, unsaturated polyester, liquid crystal polymer, polycarbonate resin, syndiotactic polystyrene, polyphenylene ether, polyphenylene sulfide, polyether sulfone resin, polyether ketone resin and polyarylate resin, and thermosetting resins such as epoxy resin, modified epoxy resin, silicone resin, modified silicone resin, polybismaleimide triazine resin, polyimide resin and polyurethane resin. In addition, particles or fibers of glass, silica, titanium oxide, magnesium oxide, magnesium carbonate, magnesium hydroxide, calcium carbonate, calcium hydroxide, calcium silicate, magnesium silicate, wollastonite, mica, zinc oxide, barium titanate, potassium titanate, aluminum borate, aluminum oxide, zinc oxide, silicon carbide, antimony oxide, zinc stannate, zinc borate, iron oxide, chrome oxide, manganese oxide, carbon black, or the like as filler or color pigment may be contained in the resin material.

Although the resin portion in this embodiment has a rectangular outline shape, it can be polygonal shapes such as octagon, or a circular shape as viewed in plan view. An optical member such as a lens can be provided on the upper surface of the resin portion if required.

In addition to a rectangular shape, the outline shape of the recessed portion can be polygonal shapes such as octagon, or a circular shape as viewed in plan view. The shape of opening of the recessed part may be different from the shape of its bottom surface.

(Sealing Resin 40)

The recessed part of the resin portion 30 is filled with sealing resin 40 as shown in FIG. 6A. The sealing resin 40 serves a protection member that covers the light emitting elements, the wires, and parts of the lead frames, and protects them from dust, smoke, moisture, external force, and the like. The sealing resin is preferably formed of an electrically insulating material and material transmitting light from the light emitting elements. Preferably the transmittance of the light is not less than 70%. Examples of the material of the sealing resin can be provided by epoxy resin, modified epoxy resin, silicone resin, modified silicone resin, phenol resin, polycarbonate resin, acrylate resin, TPX resin, polynorbornene resin, and hybrid resin containing one or more types of these resins. In particular, a silicone resin or an epoxy resin is suitably used as the sealing resin since it has good electrically insulating and weather resistance properties.

(Wavelength Conversion Member)

In addition, a wavelength conversion member can be provided which converts the wavelength of light from the light emitting elements 1. The wavelength conversion member can be arranged in a region facing the light emitting surfaces of the light emitting elements 1, or in proximity to them. For example, the wavelength conversion member can be provided in the sealing resin 40, which covers the light emitting elements 1. Alternatively, a plate-shaped member containing the wavelength conversion member which has been separately formed may be coupled to the light emitting surfaces of the light emitting elements. The wavelength conversion member can be disposed so as to be spaced away from the light emitting elements so that adverse effect of the light emitting elements can be reduced which degrades the wavelength conversion member. The plate-shaped wavelength conversion member may be coupled to the light emitting elements through an intermediate member such as an adhesive, or be directly bonded to the light emitting elements. Surface activated bonding method, hydroxyl group bonding method, or atomic diffusion bonding method can be used for the direct bonding, for example.

A phosphor can be used as the wavelength conversion member. For example, in the case where blue LEDs are used as the light emitting elements, a YAG phosphor or a phosphor generating red light such as KSF phosphor can be used as the wavelength conversion member. The YAG phosphor emits yellow light and KSF phosphor emits red light as a result of excitation by the blue light from the blue LEDs. In the case where LEDs have InGaN semiconductor layer are used as the semiconductor light emitting elements, and a YAG phosphor activated by a rare earth element is used, blue light from the LEDs, and yellow luminescent radiation emitted from the phosphor by excitation with the blue light of the LEDs can be obtained. Therefore, white light can be provided by the color mixture. According to this configuration, a white light emitting device can be provided. Also, two or more types of phosphors can be used if necessary. For example, in the case where a phosphor which emits red range light is included, warm white light can be provided by adding a reddish component to the white light. Any other color light than white can be also obtained. In this embodiment, the light emitting device includes the light emitting diodes emits blue light that is the peak wavelength in a range of 445 to 455 nm, and YAG, LAG and SCASN phosphors which can emit yellow radiation, yellowish green radiation and red radiation, respectively, when excited by blue light from the light emitting diodes, the light emitting device can emit incandescent color light by mixing these colors.

A filler may be additionally included in the sealing resin 40. Examples of the material of the filler can be silica, titanium oxide, aluminum oxide, zirconium oxide, magnesium oxide, magnesium carbonate, magnesium hydroxide, calcium carbonate, calcium hydroxide, calcium silicate, zinc oxide, barium titanate, aluminum oxide, iron oxide, chrome oxide, manganese oxide, glass, and carbon black.

The sealing resin 40 can have double-layer structure which includes a wavelength conversion layer which includes a wavelength conversion layer region and a filler layer, which is arranged above the wavelength conversion layer region and includes a filler. Also, the sealing resin can have multilayer structure which includes first resin layer containing the wavelength conversion member such as the phosphor is mixed for the wavelength conversion function and second resin sealing layer which includes a filler for reducing light-output unevenness.

First Lead Frame 10

The first and second lead frames 10 and 20 are preferably formed of metal plates. As shown in FIG. 4, the first lead frame 10 includes a mount portion 11 which has a substantially planar shape, and one or more extension portions 12 which extend from the edge(s) of the mount portion 11. The extension portions 12 protrude from the four corners of the mount portion 11 so as to be in parallel to each other. It is preferable that upper surfaces of the extension portions 12 are coplanar with the upper surface of the mount portion 11 as shown in FIGS. 4 and 6B. The back surface of the mount portion 11 is exposed from the back-surface side of the resin portion 30. The first and second lead frames 10 and 20 are embedded in the resin portion 30 so that their back surfaces are coplanar with the bottom surface of the resin portion 30.

In this embodiment, although the light emitting elements 1 are mounted on the first lead frame 10 formed of a metal plate, the light emitting elements 1 are electrically insulated from the first lead frame 10. The first lead frame 10 does not provide electrical connection between the light emitting elements and the outside. The first lead frame 10 has good heat dissipation which thermally conducts heat generated from the light emitting elements 1. Specifically, the first lead frame 10 is formed of a high thermally conductive metallic material, or coated with a high thermally conductive metallic material.

The first lead frame 10 is exposed from the back-surface side of the light emitting device as shown in FIG. 3. According to this configuration, when an external heat dissipating member such as a heat sink is arranged on the back-surface side of the resin portion 30 and is thermally coupled to the first lead frame 10, the heat dissipation properties can be further improved. Since the first lead frame 10 does not provide electrical connection, the first lead frame 10 can have dedicated structure to heat dissipation.

The first lead frame 10 may be formed of a metal plate having good heat dissipating properties such as a Cu plate. In addition, the first lead frame 10 is coated with a first metal layer 13 which has a higher light reflectivity than the second lead frame 20. According to this configuration, light from the light emitting elements 1 that travels toward the bottom-surface side is reflected on the surface of the first metal layer 13, which has a higher reflectivity than the second lead frame 20, so that the light can travel toward the light-extraction-surface side. As a result, the light output can be improved. Ag can be suitably used as a material for the first metal layer 13. In this embodiment, the first lead frame 10 is formed of a Cu plate, and plated with Ag as the first metal layer 13.

The extension portions 12 are exposed from lateral surfaces of the resin portion 30 as shown in the perspective view of FIG. 1. More specifically, the end surfaces of the extension portions 12 are substantially coplanar with the lateral surfaces of the resin portion 30. According to this arrangement, heat can be dissipated from these parts. In addition, when the light emitting device is mounted on a circuit board, the light emitting device can be precisely positioned.

Second Lead Frame 20

The second lead frame 20 includes a pair of lead frame components 20A and 20B which serve as the positive and negative terminals of the light emitting device. Each of the pair of lead frame components 20A and 20B includes a first connection portion 21, and second connection portions 22. The first connection portion 21 is arranged on outside of one of two opposed sides of the resin portion 30. The second connection portions 22 continuously extend from the first connection portion 21 to inward of the resin portion 30. The second connection portions 22 of one of the pair of lead frame components extend toward the second connection portions 22 of another one of the pair of lead frame components, respectively. The first connection portions 21 of the pair of lead frame components are arranged on the two opposed outer sides of the resin portion 30, and mainly serve as external connection terminals for electrical connection between the light emitting device and the outside. The second connection portions 22 mainly serve as internal connection terminals for electrical connection to the light emitting elements 1 or to a protection element 2 (discussed later).

As shown in the perspective view of FIG. 1, the first connection portions 21 are connected to some of light emitting elements 1 by wire bonding. In detail, light emitting elements 1B, which are located on the end of the area on which the light emitting elements are connected in series to other light emitting elements are connected to the first connection portions 21 by wires, for example. The first connection portion 21 may be formed of a material having good mechanical connection properties suitable for wire bonding. In addition, the material of the first connection portion 21 may have low electric resistance, or high electric conductivity.

The second connection portions 22 are integrally formed with the first connection portion 21. In this embodiment, the second connection portions 22 continuously extend in parallel to each other from the ends of the first connection portion 21, which is elongated in one direction, in the direction perpendicular to the one direction toward each other. The second connection portions 22 are formed of a metal plate, and formed by bending the metal plate. It is preferable that the pair of lead frame components 20A and 20B have substantially the point symmetrical shape of line symmetry. According to this configuration, since the lead frame components 20A and 20B can serve as one common lead frame component, the production cost can be reduced, or the production process can be simplified.

The first and second lead frames 10 and 20 are embedded in the resin portion 30. And some portions (that is, second connection portions 22) of the second lead frame 20 being located above the first lead frame 10 as shown in FIGS. 4, 5, and 6B. More specifically, the first and second lead frames 10 and 20 have overlap portions CR where the second connection portions 22 of the second lead frame 20 overlap the extension portions 12 of the first lead frame 10 as viewed in plan view as shown in FIG. 5. The overlap portions CR are embedded in the resin portion 30. According to this configuration, the mechanical strength of the package 4 can be improved. In particular, when the overlap portions CR are positioned in areas away from the ends of the first and second lead frames, the mechanical strength can be further improved as compared with the case where the overlap portions CR are positioned in areas on the ends of the first and second lead frames. Although the first and second lead frames overlap each other in the overlap portions CR in the plan view, the first and second lead frames are not in contact with each other, and one of them is raised or lowered in the overlap portions CR as shown in FIG. 6 In this specification, the term "the overlap portions are positioned in an area away from the ends of the first and second lead frames" means that the overlap portion are provided by crossing the first and second lead frames not in a T shape but in X shape. The angle formed by the first and second lead frames in the overlap portion can be suitably selected it is preferable that this angle is substantially a right angle in terms of the strength of the package. In other word, the first lead frame and the second lead frame have a first overlap portion and a second overlap portion, respectively. The first overlap portion and the second overlap portion overlap at an overlap position so that the first lead frame extends from the overlap position toward a first direction and a second direction opposite to the first direction and so that the second lead frame extends from the overlap position toward a third direction and a fourth direction opposite to the third direction as viewed in plan view.

The second lead frame 20 is preferably coated with a second metal layer 23 which has a higher electric conductivity than the first lead frame 10. The second metal layer 23 is preferably formed of a material which can provide good electrical connection and reduces deterioration caused by sulfuration. For example, the second metal layer 23 preferably includes Au. This configuration is advantageous in electrical connection. In particular, in the case where the light emitting elements are connected to the second lead frame by Au wires, the second metal layer 23 containing Au can provide good connection to the wires. In addition, since the wire disconnection caused by sulfuration can be prevented, a reliable lead frame for power supply can be provided. In this embodiment, a metal plate of copper alloy is coated with Ni and Pd as a primary layer, and is then plated with Au as the second metal layer 23. The metal plate can be formed of iron, for example.

The first and second lead frames 10 and 20 are covered by the resin portion 30. An upper surface of the first lead frame 10 and an upper surface of the first connection portions 21 of the second lead frame 20 are coplanar with each other as shown in the cross-sectional view of FIG. 6B, and are covered by the resin portion 30. The second connection portions 22 of the second lead frame 20 are partially bent in a region toward the first connection portion sides to form a plane including the bent second connection portions 22 which level is higher than the plane including the first connection portions 21.

It is preferable that the second lead frame 20 is covered by the second metal layer 23 before the bending, in the case where the second lead frame 20 is covered by the second metal layer 23. According to this procedure, cracks of the plating layer and the primary layer can be prevented in bending.

The second connection portions 22 are exposed from the upper surface of the resin portion 30. The second connection portions 22 are positioned above the first lead frame 10, and overlap portions of the extension portions 12. Since the overlap portions CR are provided by overlapping the second lead frame 20 with the first lead frame 10 so that the metal plate of the second lead frame 20 is positioned at a higher level than the metal plate of the first lead frame 10 in the resin portion 30, the metal plates which have such overlap portions can serve as reinforcement members. With this configuration, the mechanical strength of the package 4 can be improved.

Figure 11:
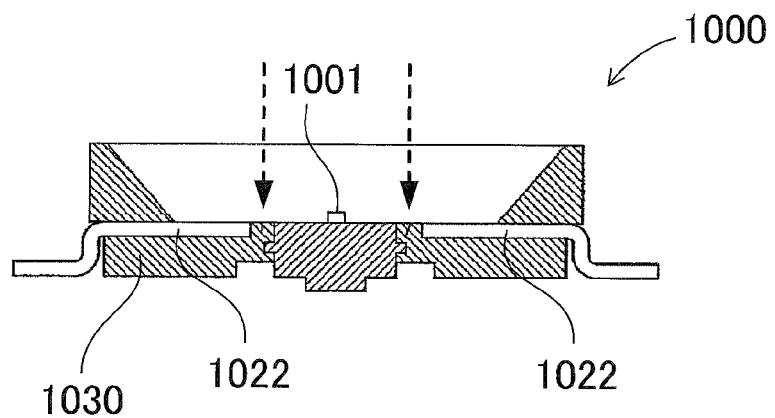
FIG. 11 is a schematic vertical cross-sectional view showing the known light emitting device.

The pair of lead frame components (that is, positive and negative terminal components) are spaced away from each other for electrical insulation between them. For example, in the case of a light emitting device 1000 shown in a cross-sectional view of FIG. 11, gaps indicated by arrows are formed between lead frames 1022 formed of metal plates so that the mechanical strength of regions around these gaps will be low. When a bending stress is applied to the gap parts in the cutting step of the lead plates, a resin package 1030 may be damaged.

In this embodiment, a separate lead frame is arranged along the gap between the pair of lead frame components, which provide electrical connection, so as to intersect the crack line along which the package is likely to break. As a result, the package can be reinforced against the bending stress. Specifically, as shown in the perspective view of FIG. 4, the pair of lead frame components 20A and 20B, which provide electrical connection, have symmetrical shape, and are spaced away from each other as the positive and negative terminal components. In this case, the spaced areas between the second connection portions 22 (so-called pn gap PNG) will have low mechanical strength. Since the second connection portions 22 protrude toward each other from the two ends of the first connection portions 21, which are elongated in one direction, the pn gaps PNG are produced between the second connection portions 22 of the pair of lead frame components 20A and 20B as shown in FIG. 4, respectively. In this embodiment, two second connection portions 22 protrude from both sides of each lead frame components 20A and 20B respectively, and such pair of protruding second connection portions 22 are facing each other, to form the pn gaps PNG between the ends of the protruding second connection portions 22. As shown in FIG. 4, total four second connection portions 22 are arranged, and two pn gaps PNG are defined at the approximately center of the package 4. In this arrangement, a fragile area FA between single-dot-dashed lines shown in FIG. 4, which has low mechanical strength against the bending stress may exist a region between the two pn gaps PNG. To address this, in this embodiment, the first lead frame 10 as the separated member intersects the fragile area FA. According to this configuration, the fragile area FA can be mechanically reinforced so that the resistance to the stress can be increased. As a result, the reliability of the package can be improved. Therefore, yield in production can be improved. In particular, since the first lead frame 10 is formed of a metal plate, and the mount portion 11 has a planar shape, the mechanical strength can be substantially improved as compared with the known device shown in FIG. 11.

The lead frames are partially exposed from the resin portion 30 in the recessed part. More specifically, the upper surfaces of the first and second lead frames 10 and 20 are exposed in the recessed part of the resin portion 30 so that the light emitting elements 1 are electrically connected to the exposed surfaces of the lead frame 20. The upper surfaces of the lead frame 20 provide electrical connection between the light emitting elements 1 inside of the package 4. The bottom and lateral surfaces of the second lead frame 20 which are exposed from the bottom and lateral surfaces of the resin portion 30 can provide electrical connection to the outside.

As shown in the cross-sectional view of FIG. 6B, the upper surfaces of the first and second lead frames 10 and 20 in which wire bonding is conducted are substantially coplanar with each other and the overlap portions CR of the second lead frame 20 are positioned higher than the overlap portions CR of the first lead frame 10. According to this configuration, the wire bonding can be easily conducted between the first and second lead frames or the light emitting elements 1, since the areas in which wire bonding is conducted from one to another are coplanar with each other, while the mechanical strength can be improved since the first and second lead frames overlap each other in the areas away from the ends of the lead frames so that the height difference is provided between the first and second lead frames in the area in which wire bonding is not conducted from one to another. In addition, the portions of the pair of lead frame components 20A and 20B which are positioned higher than the first lead frame 10 are substantially coplanar with each other. According to this configuration, in the cases where the protection element 2 is mounted to one of these parts as shown in the perspective view of FIG. 4, the wire bonding for the protection element 2 can be easily conducted from one of the second lead frame components 20 to another.

(Protection Element 2)

The protection element 2 can be included for protecting the light emitting elements 1 from the static electricity, or the like. The protection element 2 prevents damage to the light emitting elements 1 if a reverse voltage is applied. A Zener diode or the like can be suitably used as the protection element 2 which is connected in parallel to the light emitting elements 1 so that the forward voltage direction of the Zener diode is opposite to the forward voltage direction of the light emitting elements 1. Alternatively, a varistor may be used as the protection element. In the embodiment shown in FIGS. 1, 2, etc., the protection element 2 is connected to the second connection portions that face each other. More specifically, the Zener diode includes electrodes on its upper and lower surfaces. The Zener diode is directly mounted on one of the second connection portions, and the upper-side electrode of the Zener diode is connected to another one of the second connection portion through a wire. That is, the light emitting elements 1 are mounted on the first lead frame 10, and the protection element 2 is mounted on the second lead frame 20 so that they are physically spaced away from each other. Since the protection element 2 is mounted on the second connection portion of the second lead frame 20, which is positioned higher than the first lead frame 10, the height levels of the light emitting elements 1 and the protection element 2 are different from each other. According to this arrangement, light from the light emitting elements is less likely to directly irradiate on the protection element. As a result, the light absorption by the protection element can be reduced. In the embodiment shown in FIG. 1 the Zener diode includes the both electrodes on its upper and lower surfaces, a Zener diode may be used which includes the both electrodes on its upper surface, and the both electrodes may be connected to the second connection portions through two lines of wire. Also, any suitable protection elements and connection methods can be used.

The second connection portion 22 on which the protection element 2 is mounted has an electrical connection surface which is exposed from the frame part 31 of the resin portion 30 as shown in the plan view of FIG. 2. In other words, the protection element 2 is not arranged on the bottom surface of the recessed part where the light emitting elements 1 are arranged. According to this arrangement, the absorption of light from the light emitting elements 1 by the protection element 2 can be reduced so that the light output reduction can be avoidable.

In the case where the second connection portion 22 is exposed from the upper surface of the resin portion 30, it is preferable that the second connection portion 22 is exposed at the level lower than the upper surface of the frame part 31 of the resin portion 30. According to this arrangement, undesired electrical connection can be avoided. A second bottom surface of the recess part is formed at the level lower than the top surface of the frame part 31 of the resin portion 30, which is coupled to the inner side surface, as shown in the perspective view of FIG. 1. The second connection portion 22 is exposed on the upper surface of the second bottom surface. After the protection element 2 is placed on the second bottom surface, the recessed part is filled with the sealing resin 40. As a result, members inside the recessed part including the second connection portion 22 can be protected. In the case where the protection element 2 is connected by wire-bonding, the height of the wire and the level of the second bottom surface are designed so that the wire is completely embedded in the sealing resin 40.

Although the protection element 2 has been illustratively described which is arranged on the second bottom surface in the recessed part of the resin portion 30 in the embodiment shown in FIG. 2 or the like, the second connection portion and the protection element may be embedded in the resin portion.

As discussed above, since one of the separated lead frames as the first and second lead frames 10 and 20 is raised or lowered so that they have the overlap portions CR, and the overlap portions CR are embedded in the resin portion, the mechanical strength of the light emitting device can be improved. In addition to this, since the first and second lead frames 10 and 20 are formed of materials suitable for installation of the light emitting elements 1 and for power supply to the light emitting elements 1, respectively, a light emitting device with improved reliability can be provided.

Second Embodiment

Figure 7:
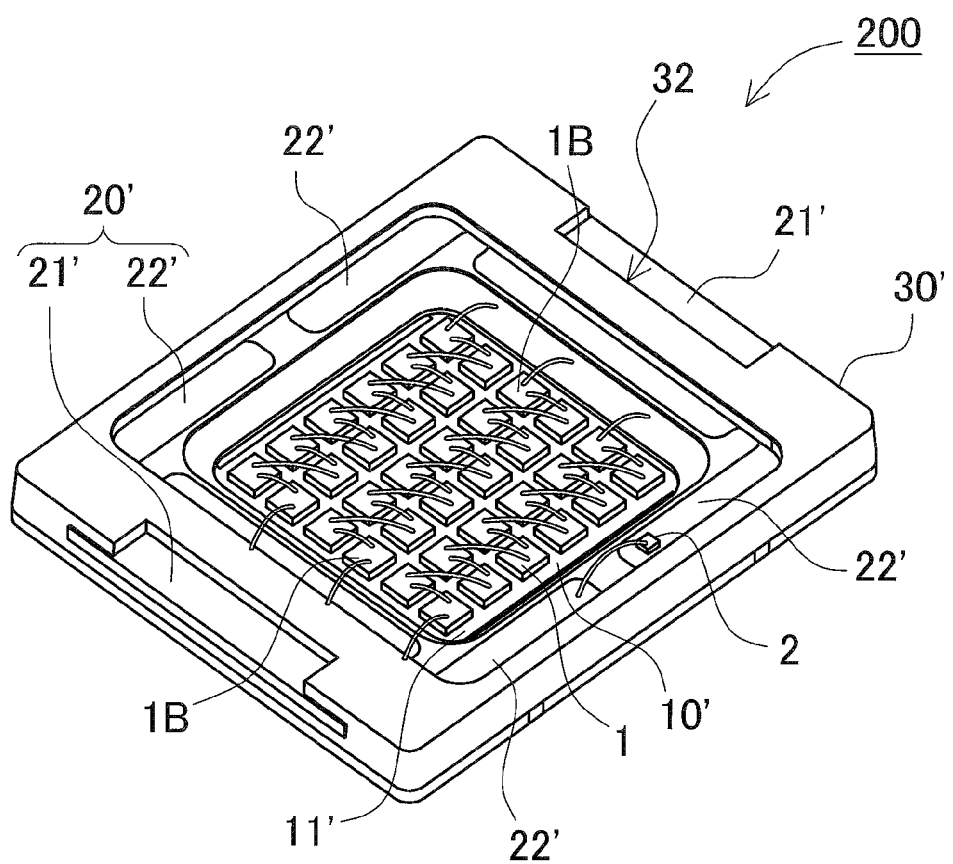
FIG. 7 is a schematic perspective view showing a light emitting device according to a second embodiment of the present invention.
Figure 8:
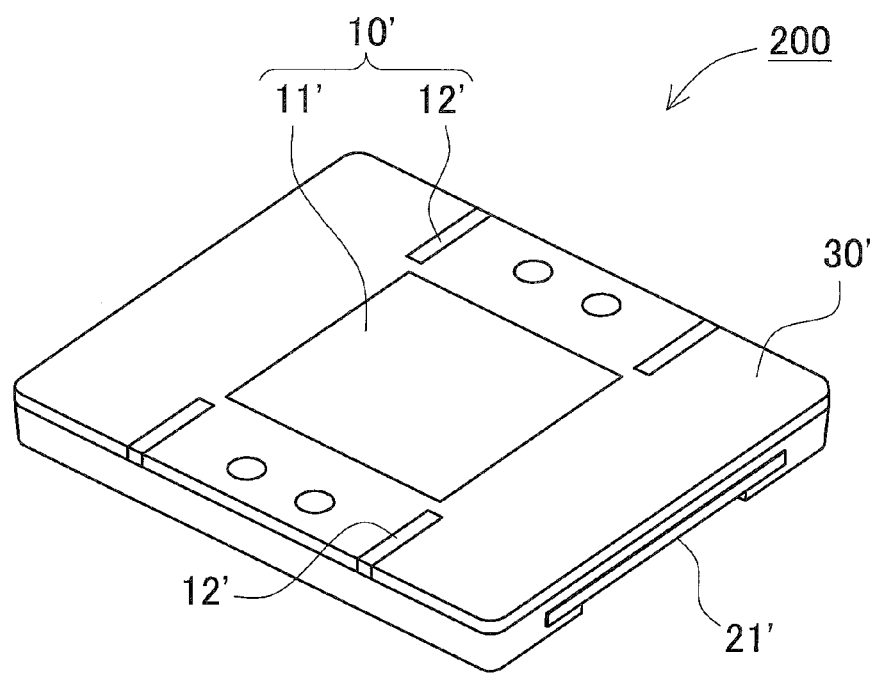
FIG. 8 is a schematic perspective view showing the light emitting device shown in FIG. 7 as viewed from the bottom side.

In the first embodiment, the first connection portions 21 protrude from the two opposed side surfaces of the resin portion 30. The first connection portions may not protrude from the side surfaces of the resin portion. In this case, for example, the upper surface of first connection portions may be coplanar with the top surface of the resin portion, which is coupled to the lateral surfaces of the resin portion, so that the surface of the first connection portion is exposed from the resin portion. Alternatively, the resin portion 30 may be formed in a shape which has indentations on its upper surface so that the terminals connectable to the outside expose from the resin portion 30. FIGS. 7 and 8 show this type of light emitting device 200 according to the second embodiment. Specifically, FIGS. 7 and 8 show perspective views from the top and bottom sides, respectively. The illustrated light emitting device 200 also includes the light emitting elements 1, and the package 4. The package 4 includes the first and second lead frames 10' and 20', and a resin portion 30'. The light emitting elements 1 are mounted on one of the surfaces of the first lead frame 10'. The light emitting elements 1 are electrically connected to the second lead frame 20'. The first and second lead frames 10' and 20' are embedded in the resin portion 30'. The first lead frame 10' includes a planar mount portion 11', and extension portions 12' which extend from the ends of the mount portion 11'. The second lead frame 20' includes first and second connection portions 21' and 22'. The components according to the second embodiment similar to the first embodiment are attached with the same reference signs as the first embodiment, and their description is omitted.

The first connection portions 21' are not exposed from the lateral surfaces of the resin portion 30' but the upper surfaces of the first connection portions 21' are exposed on the top-surface side through indentations 32 each of which are continuously formed from the end surfaces to lateral surfaces of the resin portion 30'. According to this configuration, the size of the light emitting device can be reduced by eliminating protrusions from the lateral surfaces of the resin portion 30', while the areas for electrical connection to the outside can be provided.

In order to facilitate dissipating heat from the light emitting elements 1, which are mounted on the first lead frame 10', the first lead frame 10' has dedicated structure to heat dissipation. For example, the first lead frame 10' is formed of a metal having good heat dissipating properties, and the back surface of the first lead frame 10' is exposed from the resin portion 30' so that the heat dissipating area is increased as shown in FIG. 8. The first lead frame 10' can be thermally conducted to an external heat sink, or the like.

(Production Processes of Light Emitting Device)

Figure 9:
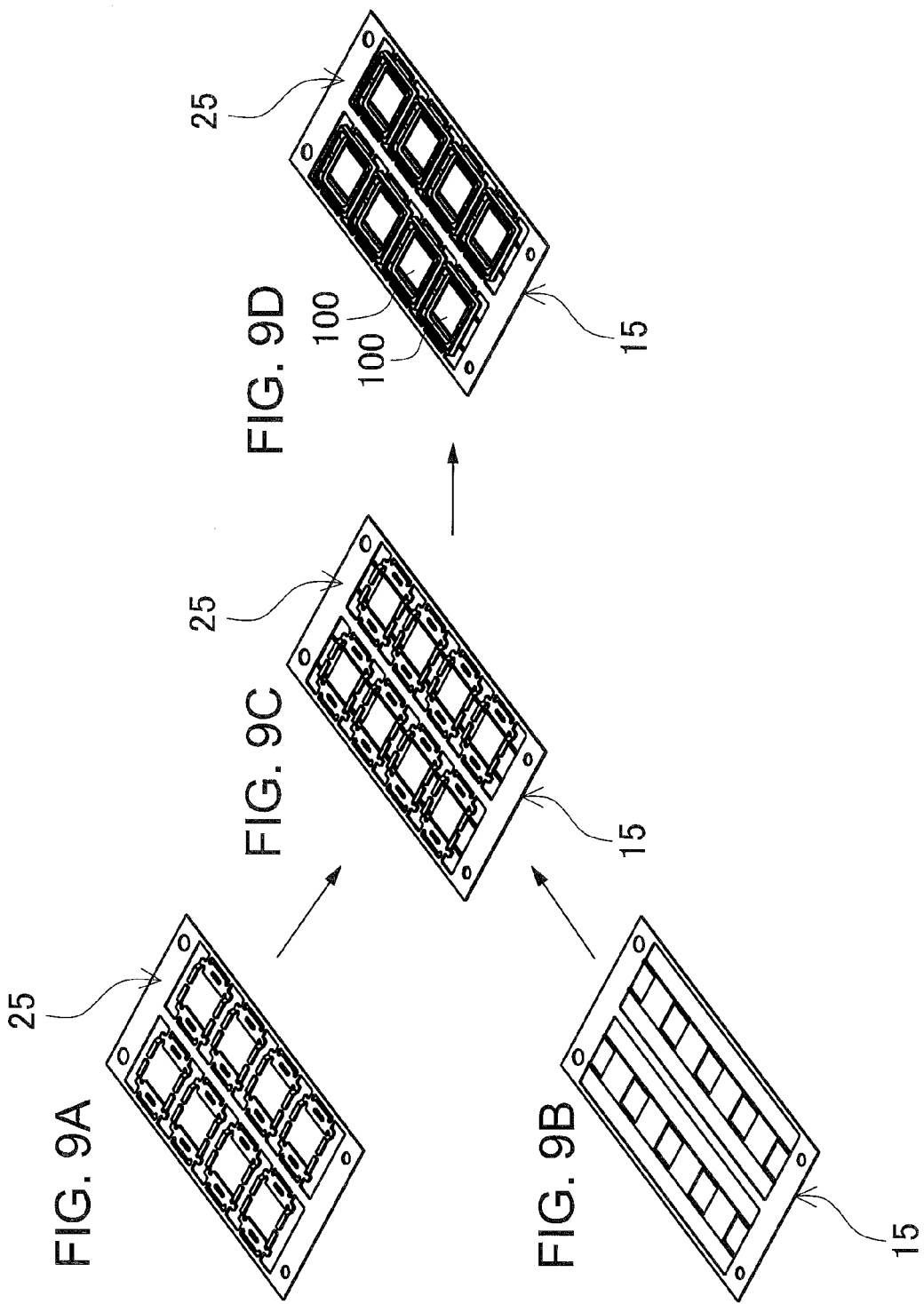
FIGS. 9A to 9D are schematic perspective views showing production processes of the light emitting device.
Figure 10:
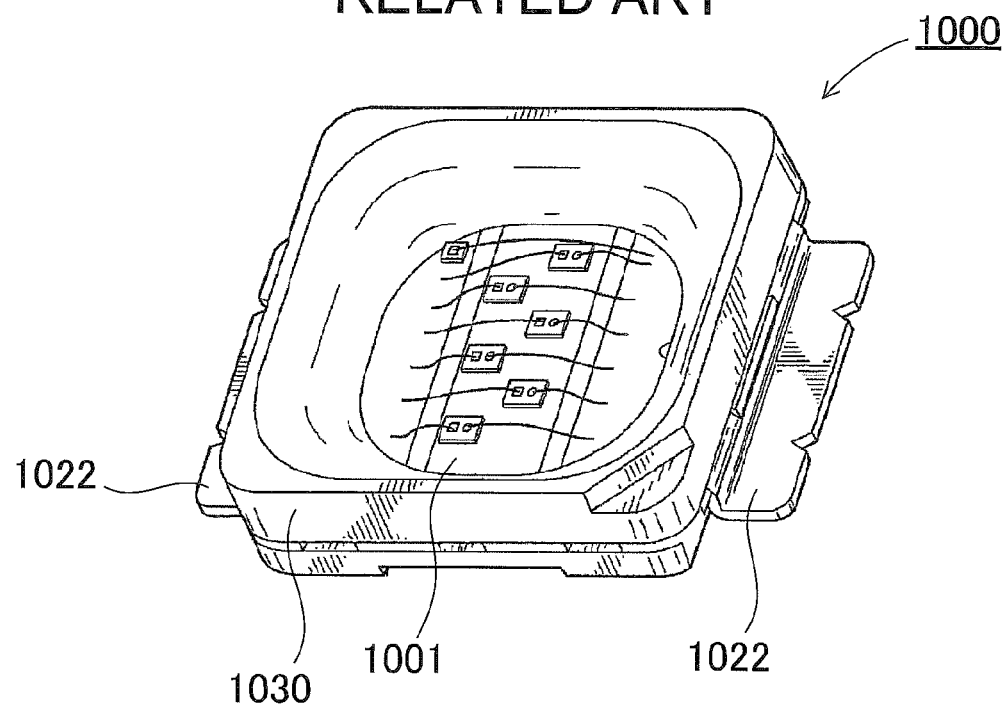
FIG. 10 is a schematic perspective view showing a known light emitting device described in the related art.

With reference to FIGS. 9A to 9D, production processes for producing of the light emitting device are now described. Frame materials 15 and 25 are first prepared. The frame material 15 or 25 includes a plurality of first or second lead frames 10 or 20 which are coupled to each other and formed by metal sheet punching, or the like. In this exemplary process, the lead frame sets are formed in a four-by-two matrix so that total eight lead frame sets are formed in rectangular metal sheets. Depending on the characteristics required for the lead frames, suitable metal materials and plating materials are selected for the frame materials 15 and 25. For example, the frame material 25 for the second lead frames 20 shown in FIG. 9A is formed of an inexpensive Fe plate which is plated with Au, which has a higher electric conductivity than Fe, as the second metal layer 23. In addition, Au is suitable for the terminal material since it is chemically stable although its electric conductivity is not so high as Ag and Cu. The frame material 15 for the first lead frames 10 shown in FIG. 9B is formed of a Cu plate which has good heat dissipating properties and is plated with Ag, which has a high reflectivity, as the first metal layer 13. The punching for forming the frame materials 15 and 25 is conducted before the materials are plated in order to efficiently produce the materials. It is preferable that the materials are plated after punching in light of reliability. The reason is that the cut surface of the material, which is formed by the punching, is plated with the plating material.

Next, the frame materials 15 and 25 overlap each other and are held together as shown in FIG. 9C, and the resin portion 30 is then formed by resin molding, or the like as shown in FIG. 9D. In the formation process of the resin portion 30, the frame materials 15 and 25 are held and covered by the resin material with the first and second lead frames 10 and 20 being spaced away from each other and the overlap portions CR being provided by partially overlapping the first and second lead frames with each other as viewed in plan view. Thus, the package 4 is formed including the resin portion 30 in which the overlap portions CR are embedded. The resin portion 30 can be formed by any suitable known methods such as injection molding and transfer molding. After that, the light emitting elements 1 and the protection element 2 are mounted onto the corresponding lead frames. After wire bonding, the recessed parts of the resin portions 30 are filled with the sealing resin 40. Finally, frame materials are cut at the positions outside the first and second lead frames 10 and 20. As a result, the light emitting devices 100 are disconnected from the rest of the frame material. According to these processes, a plurality of light emitting devices can be produced at the same time.

According to the light emitting devices of the foregoing embodiments, since the lead frames are formed of materials suitable for installation of the light emitting elements 1 and for power supply to the light emitting elements 1, and partially overlap each other in the resin portion as discussed above, a quality light emitting device which has high strength and is resistant to high pressure can be provided.

A light emitting device and a method for producing a light emitting device according to the embodiment of the present invention can be widely applied to semiconductor light emitting devices such as LEDs and laser devices to be used for lighting sources, LED displays, back light sources, signal lights, illuminated switches, various types of sensors and indicators and the like, and methods for producing these semiconductor light emitting devices.

A light emitting device according to the embodiment of the present invention includes a light emitting element, and a package. The package includes first and second lead frames, and a resin portion. The light emitting element is mounted on one of the surfaces of the first lead frame. The light emitting element is electrically connected to the second lead frame. The first and second lead frames are covered by the resin portion. The first and second lead frames are spaced away from each other. The first and second lead frames are at least partially overlapped by each other in an area away from the ends of the first and second lead frames as viewed in plan view so that they have overlap portions. The overlap portions are embedded in the resin portion. The first and second lead frames are formed from different types of metal plates or coated with different types of metals.

A method according to the embodiment of the present invention produces a light emitting device which includes a light emitting element, and a package. The package includes first and second lead frames, and a resin portion. The light emitting element is mounted on one of the surfaces of the first lead frame. The light emitting element is electrically connected to the second lead frame. The first and second lead frames are covered by the resin portion. The method includes a lead-frame-holding step and a package-forming step. In the lead-frame-holding step, the first lead frame and the second lead frame are held so that the first and second lead frames are spaced away from each other, and overlap portions are provided by at least partially overlapping the first and second lead frames with each other in an area away from the ends of the first and second lead frames as viewed in plan view. The second lead frame is formed from a metal plate different from the metal type of the first lead frame or coated with a metal layer different from the metal type of the first lead frame. In the package-forming step, the first and second lead frames are covered with a resin material, and the package is formed so that the overlap portions are embedded.

According to the aforementioned construction, the mechanical strength can be improved by embedding the overlap portions of the first and second lead frames in the resin portion.

Obviously, numerous modifications and variations of the present invention are possible in light of the above teachings. It is therefore to be understood that within the scope of the appended claims, the invention may be practiced otherwise than as specifically described herein.

What is claimed is:

1. A light emitting device comprising:
a light emitting element; and
a package comprising:
- a first lead frame having a first surface on which the light emitting element is provided, the first lead frame having a first overlap portion and an entire outer surface made from a first metal;
- a second lead frame spaced apart from the first lead frame and having a second overlap portion, the second lead frame being electrically connected to the light emitting element and having an entire surface made from a second metal different from the first metal, the first overlap portion and the second overlap portion overlapping at an overlap position;
- a resin covering the first lead frame and the second lead frame, the first overlap portion and the second overlap portion being embedded in the resin, wherein the first overlap portion extends in a first direction to the overlap position along a first line defined by the first surface, and the second overlap portion extends to the overlap position along a second line substantially perpendicular to but not coplanar with the first line.

2. The light emitting device according to claim 1, wherein the first and second lead frames are embedded in the resin which is located between at least a part of the second lead frame and the first lead frame.

3. The light emitting device according to claim 1, wherein the first lead frame is electrically insulated from the light emitting element.

4. The light emitting device according to claim 1, wherein the first lead frame is configured to be electrically insulated from outside of the light emitting device, and thermally conducts heat generated by the light emitting element.

5. The light emitting device according to claim 1, wherein the first lead frame is covered by a first metal layer that has a higher reflectivity than the entire outer surface of the second lead frame.

6. The light emitting device according to claim 1, wherein the first lead frame is covered by a first metal layer containing Ag.

7. The light emitting device according to claim 1, wherein the second lead frame is covered by a second metal layer that has a higher electric conductivity than the entire outer surface of the first lead frame.

8. The light emitting device according to claim 1, wherein the second lead frame is covered by a second metal layer containing Au.

9. The light emitting device according to claim 1, wherein the first lead frame includes a mount portion that has a planar shape, and at least one extension portion that extends from an edge of the mount portion, wherein a back surface of the mount portion is exposed from a back surface of the resin.

10. The light emitting device according to claim 9, wherein the second lead frame includes a pair of lead frame components which serve as positive and negative terminals, wherein each of the pair of lead frame components includes a first connection portion that is located on one of two opposed sides of the resin, and a second connection portion that continuously extends inward of the resin from the first connection portion, and the second connection portions of the pair of lead frame components extend toward each other, and wherein the first and second overlap portions are defined by overlapping the second connection portion and the at least one extension portion with each other.

11. The light emitting device according to claim 10, wherein the second connection portion is bent in one area of the second connection portion on a first connection portion side so that the light emitting element is located between a plane including another area of the second connection portion and a plane including the first connection portion.

12. The light emitting device according to claim 10, wherein the second connection portions are exposed in an upper surface of the resin.

13. The light emitting device according to claim 10, wherein the pair of lead frame components are substantially symmetrical.

14. The light emitting device according to claim 10, wherein the pair of lead frame components are spaced away from and opposed to each other in the resin, wherein the first lead frame is located between the pair of lead frame components.

15. A method for producing a light emitting device, comprising:
providing a first lead frame having a first surface on which a light emitting element is to be provided, the first lead frame having a first overlap portion and an entire outer surface made from a first metal;
providing a second lead frame so that the second lead frame is spaced apart from the first lead frame, the second lead frame being to be electrically connected to the light emitting element, having a second overlap portion, and having an entire surface made from a second metal different from the first metal;
arranging the first lead frame and the second lead frame so that the first overlap portion and the second overlap portion overlaps at an overlap position, so that the first overlap portion extends in a first direction to the overlap position along a first line defined by the first surface, and the second overlap portion extends to the overlap position along a second line substantially perpendicular to but not coplanar with the first line; and
covering the first lead frame and the second lead frame with a resin material so as to embed the first overlap portion and the second overlap portion in the resin material and so as to provide a package to include the first lead frame and the second lead frame in the package.

* * * * *